(12) United States Patent
Scholler

(10) Patent No.: US 6,176,901 B1
(45) Date of Patent: Jan. 23, 2001

(54) DUST PRECIPITATOR

(75) Inventor: Johann Scholler, Eppertshausen (DE)

(73) Assignee: Leybold Systems GmbH, Hanau (DE)

( * ) Notice: Under 35 U.S.C. 154(b), the term of this patent shall be extended for 0 days.

(21) Appl. No.: 09/176,324

(22) Filed: Oct. 22, 1998

(30) Foreign Application Priority Data

Oct. 24, 1997 (DE) ............................................. 197 47 090

(51) Int. Cl.[7] ................................................. B01D 45/08
(52) U.S. Cl. ..................... 95/272; 55/444; 55/DIG. 25; 55/434.4; 95/282
(58) Field of Search ..................... 95/288, 272; 55/444, 55/434.2, 434.3, 434.4, DIG. 25; 96/FOR 163, FOR 164, FOR 165

(56) References Cited

U.S. PATENT DOCUMENTS

| 851,520 | * | 4/1907 | Johnson | 55/434.4 |
|---|---|---|---|---|
| 997,762 | * | 7/1911 | Derrig | 55/434.4 |
| 1,057,783 | * | 4/1913 | Tomkins | 55/434.4 |
| 3,845,813 | * | 11/1974 | Bougard | 55/434.4 |
| 3,892,550 | * | 7/1975 | Riis | 55/434.2 |
| 5,427,610 | * | 6/1995 | Croker | 95/288 |
| 5,569,315 | * | 10/1996 | Konig et al. | 55/434.3 |

FOREIGN PATENT DOCUMENTS

| 108935 | * | 2/1928 | (AT) | 96/FOR 165 |
|---|---|---|---|---|
| 622850 | * | 12/1935 | (DE) | 96/FOR 165 |
| 969 876 | | 7/1958 | (DE) | |
| 87 90 076 U | | 10/1989 | (DE) | |
| 296 01 387 U | | 6/1996 | (DE) | |
| 296 01 847 U | | 4/1997 | (DE) | |
| 45-6239 | * | 3/1970 | (JP) | 96/FOR 165 |
| 682748 | * | 8/1979 | (SU) | 96/FOR 165 |
| 1366184 | * | 1/1988 | (SU) | 96/FOR 164 |

OTHER PUBLICATIONS

*Patent Abstracts of Japan,* Publication No. 07265684 to Ayumi et al., dated Oct. 17, 1995.
*Patent Abstracts of Japan,* Publication No. 26388Y/15 to Hitachi dated Aug. 9, 1974.

* cited by examiner

*Primary Examiner*—Duane S. Smith
(74) *Attorney, Agent, or Firm*—Smith, Gambrell & Russell, LLP

(57) ABSTRACT

In a dust precipitation device for filtration of dust created during crystal growth from a melt, cold surfaces are provided as contact surfaces as a part of the gas control geometry, to which the dust can adhere and thus become separated from the transport gas pumped from the processing chamber. Due to cooling of the flow contact surfaces, for example, by a coolant that is supplied via coolant lines blockable by valves, the dust is filtered very effectively from the transport gas. The extraction device has several precipitation chambers located one behind the other for the passage and filtering of the dust from the transport gas. The individual precipitation chambers are connected to each other so that they can be individually removed from or inserted into the precipitation device, for example, manually.

19 Claims, 4 Drawing Sheets

DUST PRECIPITATOR

INTRODUCTION AND BACKGROUND

The present invention pertains to a device and a method for the precipitation of dust which is created in particular during the manufacture of a crystal grown from a melt and which can be added as a dust mixture to a transport gas for diverting it from the melt chamber.

In the growth of crystals from a melt, such as in the Czochralski or Bridgeman method, or other methods for melting or remelting the starting crystalline material, the melting process takes place within processing chambers separated from the external atmosphere. In this case, the melt is held in a crucible which is located inside an evacuated vessel. Depending on the vapor pressure and the temperature of the molten material, a vapor cloud composed of the molten material forms above the melt crucible. This cloud contains particles which have diameters of less than one micrometer and which tend to agglomerate into larger particles of dust. Sufficiently large dust particles can then drop back into the melt, so that the crystallization process is disrupted, and consequently, the growth of the monocrystal must be interrupted.

In order to prevent the disruption caused by the dust, the dust particles are usually removed from the process chamber by means of a continuous gas stream. The gas used in this case is introduced through a gas inlet into the processing chamber, directed over the opening of the melt crucible, and is then vacuumed off together with the collected dust by a vacuum pump and output through an exhaust opening. Due to the highly abrasive nature of the pumped dust, which may consist of $SiO$, for example, in the growth of Si-monocrystals, the dust is usually filtered out in dust filters connected in series with the vacuum pumps. In this regard, these filters have porous surfaces to separate and collect the dust.

One problem in the use of these known filters is that their capacity for collecting dust is quickly reached when dust generation is heavy, even when they are generously proportioned with respect to the total generated quantity of dust, and these porous surfaces must then be replaced with new ones. Usually either the entire filter arrangement must be shut down to remove the filter and the gas stream must be shunted through a second, separate filter arrangement, or the filter must be designed for the maximum quantity of dust likely to be encountered. Both alternatives are less than optimal from a design standpoint and are associated with added expense. Moreover, the manual handling of these dust-laden filter elements is associated with health risks, which, in turn, can only be avoided by additional apparatus expense.

Therefore it is an object of the present invention to enable the cleaning and purification of scavenging gas used in the growth of crystals, which is easy to implement and economical to apply.

It is a further object of the present invention to provide a suitable filter apparatus to remove the dust admixed into the scavenging gas, that has a high capacity, that is easy to produce in a simple manner, and that also allows simple handling.

SUMMARY OF THE INVENTION

The above and other objects of the present invention can be achieved by precipitating the dust included in the scavenging gas, by a dust precipitator which has at least one chamber with a cooling wall surface to which the scavenging gas laden with dust and pumped from the process chamber flows past in such a manner that the dust particles remain adhered to the chamber wall upon contact with the wall, and thus are removed from the flow of gas. With the precipitation device according to the invention, even large quantities of dust can be extracted from the gas stream, since any plugging of the filter and exhaustion of the filter effect such as that in a porous screen filter cannot occur. The removed dust is held to the cooled wall surface and grows slowly in layers on this surface. Thus preferably the operating time between two required cleaning steps will be significantly increased with respect to a conventional filter dust apparatus.

The precipitation chamber itself has a chamber wall preferably cooled on all sides and a gas inlet for entry of the dust-laden gas stream and a gas outlet for exit of the purified gas. According to another feature of the invention, the adjoining chamber walls are positioned with respect to each other such that the gas control geometry allows the gas stream to flow past at least one cooled chamber wall surface to which the dust has adhered.

In order to obtain an effective cooling of the wall surface, the extraction chamber is produced with a double-walled cooling jacket whose inner chamber wall is used as a flow surface for the dust-laden scavenging gas. The cooling jacket has one coolant entry, through which the coolant flows into the cooling jacket which cools it upon contact with the wall surface, and one coolant outlet. The coolant is then shunted across a drain channel connected to the coolant outlet. The coolant inlet and the coolant outlet are connected via a locking valve to the coolant inlet line and the coolant drain, respectively.

The precipitation chamber is preferably manufactured as a single part so that it can be removed entirely from the gas exhaust line, for example, for cleaning of the cooling surfaces laden with dust. A replacement of individual filter elements installed in a filter chamber, which usually leads to undesirable swirling of dust, is thus prevented.

In order to allow the replacement of the chamber without implementing additional activities with regard to the coolant inlet itself, a valve is installed, preferably a blocking valve, in both the coolant inlet line and the coolant outlet line which automatically interrupt the flow of coolant upon removal of the dust from the chamber. In this regard, the valves are designed according to the properties of the invention.

Another advantage of the invention is obtained by placement of at least two chambers, one behind the other, such that the gas stream is first directed through the first chamber and is then directed through the second chamber. Due to the doubling of the cooled dust deposition surfaces, the service life of the individual chambers between two required cleanings is doubled. The individual chambers can be connected preferably manually together and can preferably be removed individually and completely from the precipitation device for cleaning without the filtered dust escaping into the environment such that the inlet of coolant to the other chambers is advantageously not interrupted. The subsequent cleaning of the flow surfaces can then occur, according to the invention, outside the vicinity of the crystal growth system and will have no effect on its operation.

For an appropriate use of the precipitation device according to the invention, the dust produced during crystal growth in the melt (e.g., dust produced during growth of Si-monocrystals) is first picked up by a scavenging gas introduced into the processing chamber and together with the scavenging gas according to the gas control geometry in the reaction space, which is defined by the position of the gas inlet and the gas outlet with regard to the melting crucible, is flushed out from the processing space. As scavenging gas, preferably noble gases are used, such as argon, which do not themselves react chemically with the molten material. The dust-gas mixture is pumped through an exhaust line by means of a vacuum pump from the processing space, and the dust precipitation device of the invention, positioned between the intake opening of the vacuum pump and the gas outlet of the melt chamber, is used to filter the gas. According to the invention, the dust-laden gas is directed to the precipitation device against preferably cooled chamber surfaces onto which the dust particles adhere.

In order to avoid turbulence and swirling dust within the deposition device at rough flow surfaces, the cooling surfaces have smooth, preferably polished, surfaces. Due to the herein before mentioned, preferably low, temperature of the surface and its low roughness, the dust particles reliably adhere to the surface, so that the dust filtering will be quite effective. The cleaning of the cooling surface coated with filter dust is possible preferably in a simple and effective manner, since the adhered filter dust can be easily detached from the polished cooling surfaces.

Another advantage in the use of polished surfaces is that they can be cleaned in a particularly simple manner, and residual deposits of dust adhering to the cooling surfaces can be entirely prevented. Complicated cleaning procedures, like those required for structured surfaces, are avoided according to the invention.

The gas purified of dust particles in this manner is then pumped continuously from the processing space by the pumps, preferably vacuum pumps, connected downstream to the precipitation devices, and can then be returned as treated scavenging gas to the processing space, and within the processing space, pressures from $1 \times 10^{-5}$ mbar to $1 \times 10^{-4}$ mbar can be maintained in a dynamic pressure equilibrium.

Additional configurations of the precipitation device are described in greater detail herein, together with their characterizing properties.

BRIEF DESCRIPTION OF THE DRAWINGS

The present invention will be further understood with reference to the drawings which illustrate one particularly preferred embodiment; wherein.

DETAILED DESCRIPTION OF THE INVENTION

Figure 1:
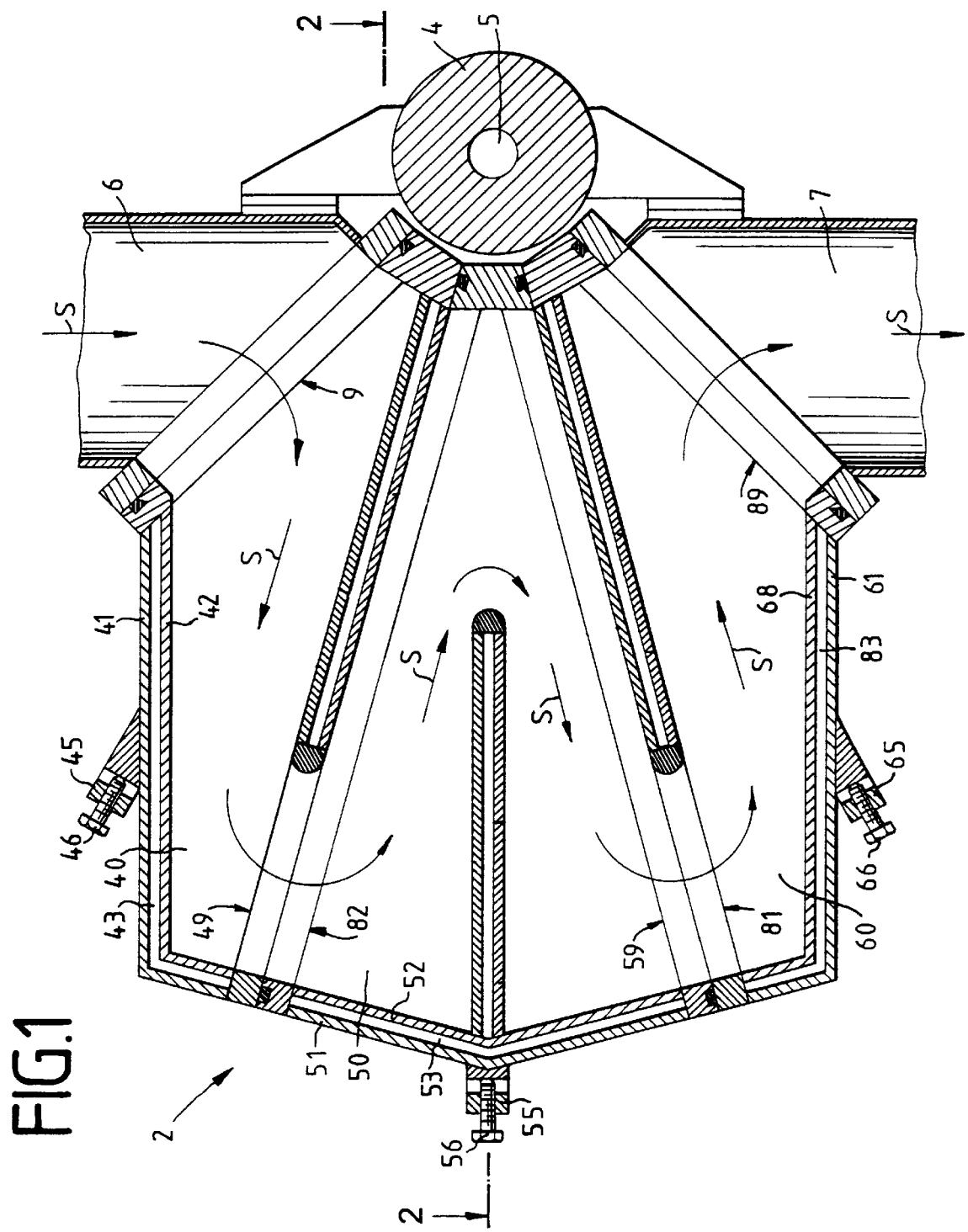
FIG. 1 is a partial sectional view of a dust precipitation device with three individual, cascaded precipitation chambers shown in cross section.

The present invention will now be described in further detail. The dust precipitation device 2 illustrated in FIG. 1 consists essentially of three individual precipitation chambers 40, 50, 60, which are positioned one behind the other in such a manner that the dust-laden scavenging gas passes through the three extraction or precipitation chambers 40, 50, 60 one after the other in the gas flow direction S indicated schematically. Thus the first precipitation chamber 40 with its gas inlet 9 is flange-connected to the exhaust line 6 connected to a process chamber, not illustrated in the drawing. The outlet 49 of the precipitation chamber 40 opens into the inlet 82 of the precipitation chamber 50, whose outlet 59 is located opposite the inlet 81 of the third precipitation chamber 60. The outlet 89 of the precipitation chamber 60 is connected to an exhaust pump line 7 which can be vented by a vacuum pump, not shown in the figures. The entire dust precipitation device 2 is located, for example, next to a crystal growth facility (e.g., for growing Si-monocrystals), not shown in the figures.

Figure 3:
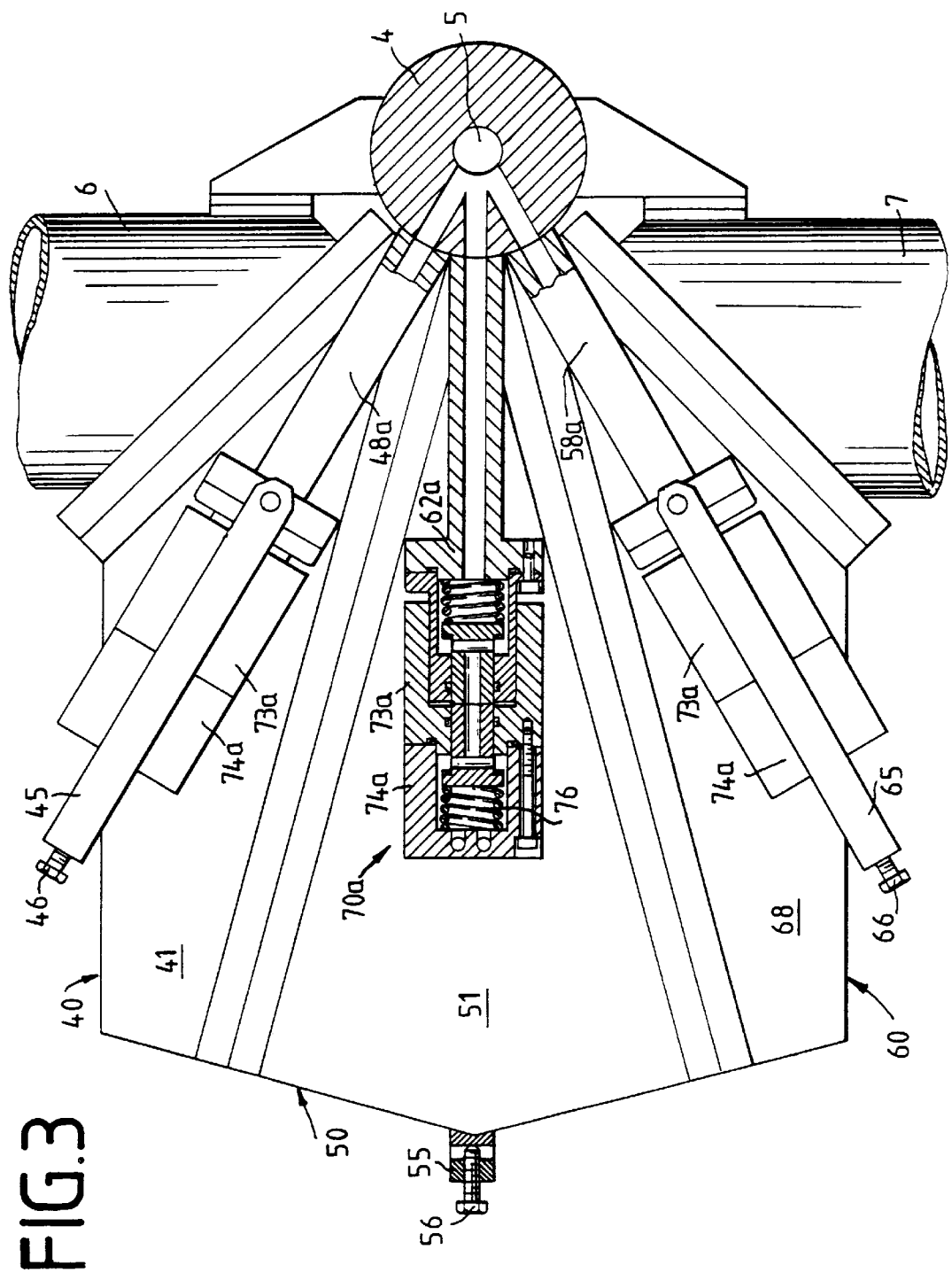
FIG. 3 is a partial top view of the embodiment illustrated in FIG. 1, in a partial cutaway view of a coolant valve and of a coolant supply line in the flow-through position.

The precipitation chambers 40, 50, 60 are of double-walled design and each consists of a chamber outer wall 41, 51, 61 and a chamber inner wall 42, 52, 68, wherein between the chamber outer wall 41, 51, 61 and the associated chamber inner wall 42, 52, 68 there is one wall channel 43, 53, 83 with a coolant flowing through. The coolant is supplied to the individual wall channels 43, 53, 83 through an inlet channel 64 (see FIG. 4) designed in guide tubes 48a, 58a, 62a (see FIG. 3), as illustrated in detail based on the one of the guide tubes; and the coolant moves through guide tubes centrally from the coolant channel 5 of a coolant distributor 4. Blocking valves 70a (see FIG. 3, FIG. 4) are installed in the guide tubes 48a, 58a, 62a between the coolant channel 5 and the individual wall channels 43, 53, 83.

Figure 4:
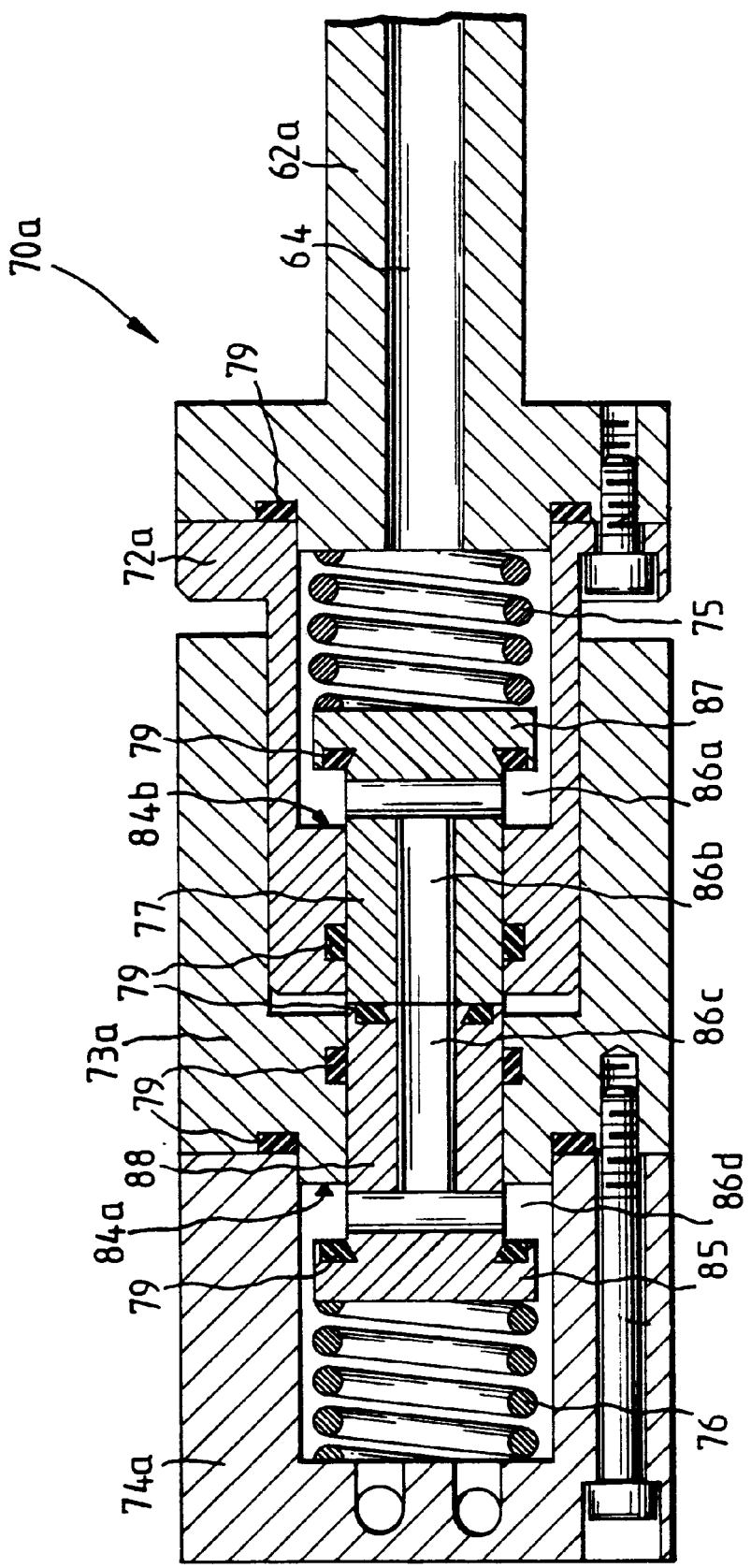
FIG. 4 is an enlarged cross section of the representation shown in FIG. 3.

As indicated in FIG. 4, for example, the valves 70a, each consist essentially of three components, namely, a valve head 74a, which is securely mounted to the particular, outer chamber wall 41, 51, 61, a guide housing 73a, which, in turn, is flange-connected to the valve head 74a, and the valve plug 72a securely connected to the particular guide tube 48a, 58a, 62a, whereby the guide housing 73a can slide axially onto the valve plug 72a.

On one end, the guide tubes 48a, 58a, 62a are connected to the coolant distributor 4 and their inlet channel 64 opens into the particular valve plug 72a (see FIG. 4), whose front side is screwed to the guide tube 48a, 58a, 62a and with the intermediate sealing element 79. The inlet channel 64 of the guide tube 62a within the valve 70a passes into the valve channel 86a and in the transit setting of the valve 70a (see FIG. 4), it is connected to the valve channel 86b and the valve channel 86c of the guide housing 73a and also to the valve channel 86d of the valve head 74a.

As indicated in FIG. 4, the valve 70a will only be in its transit setting necessary for passage of the coolant when the guide housing 73a is in the axial position on the valve plug 72a indicated in FIG. 4. In this regard, a locking pin 77 sliding axially into the valve plug 72a and a locking pin 88 seated axially in the guide housing 73a is pressed by its front sides against the spring force exerted by the compression spring 75, 76 pressed against its back side. Thus the sealing plates 85, 87 located at the end of the locking pins 77, 88 are raised from the sealing surfaces 84a, 84b of the guide housing 73a, so that the valve channels 86a, 86b, 86c, 86d are open for the flow of coolant.

Figure 2:
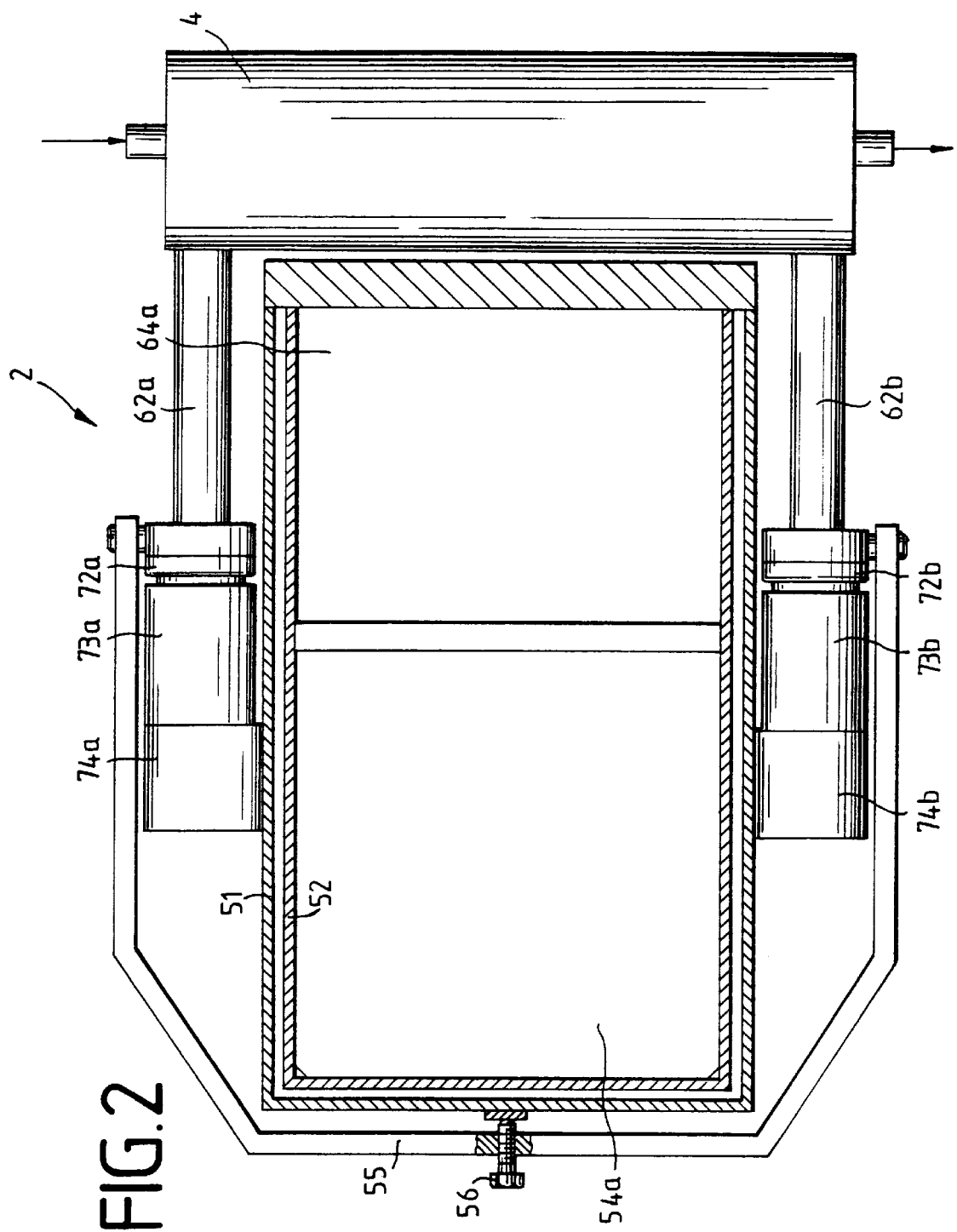
FIG. 2 is a partial sectional view of the precipitation device illustrated in FIG. 1, shown in cross section along line 2—2 indicated in FIG. 1.

In order to drain the water cooled to the inlet temperature and introduced into the wall channels 42, 52, 83 and used, e.g., as a coolant, drain channels are supplied for the valve components 72a, 73a, 74a used for the coolant line. Only the drain channel 62b is shown in FIG. 2. This drain channel 62b is connected at one end to the wall channel 53 and at the other end to the coolant channel 5. The sealing elements 79 provided both in the coolant inlet lines and also in the coolant outlet lines and in the vacuum connectors consist of elastomeric material, for example, and the gaskets are located in grooves which are cut into the detachable vacuum or coolant connectors so that an accidental loss of the sealing elements 79 can be prevented.

To remove the precipitation chambers 40, 50, 60 from the dust precipitation device 2, first a set screw 46, 56, 66 screwed into a bar 45, 55, 65 pivoting around the precipitation chambers 40, 50, 60 is loosened, and the bar 45, 55, 65 assigned to the particular precipitation chambers 40, 50, 60 is pivoted from the region of the particular precipitation chambers 40, 50, 60. The individual precipitation chambers 40, 50, 60 can now be pulled out individually together with the associated valve head 74a, 74b and the guide housing 73a, 73b from the valve plug 72a, 72b and the guide tubes 62a, 62b. The valves 70a, assigned to the particular precipitation chamber 40 thus automatically block the flow of coolant by means of the provided compression springs 75, 76.

Analogously, the precipitation chambers 50 or 60 can be removed individually from the dust precipitation device 2.

Upon re-insertion of the precipitation chamber 40, the reverse procedure is followed. The flow of coolant through the inlet channel 64 of the guide tube 62a is then readily established, as described above, by opening the valves 70a.

Further variations and modifications of the foregoing will be apparent to those skilled in the art and are intended to be encompassed by the claims appended hereto.

What is claimed is:

1. In a system for growing silicon monocrystals from a silicon melt, wherein the system includes a melt chamber for holding the silicon melt and a device for collecting dust present over a surface of the silicon melt by capturing the dust in a gas stream to thereby produce a dust-gas mixture, and moving the dust-gas mixture away from the surface of the silicon melt, wherein the improvement comprises: including, as a portion of the device for collecting dust, a device for precipitation of the dust which is created during the manufacture of the silicon monocrystals grown from the silicon melt, which dust is diverted from the melt chamber as the dust-gas mixture, wherein the device for precipitation includes at least one precipitation chamber, said precipitation chamber having at least one wall surface against which the dust-gas mixture flows in such a manner that upon contact with the wall surface, the dust adheres to said wall surface, so that the dust is precipitated from the gas.

2. The system according to claim 1, wherein said wall surface is at least partly a double-walled chamber wall, and the double-walled chamber wall has a wall channel to which a coolant is supplied.

3. The system according to claim 1, wherein the wall surface is formed throughout as a double wall and has one gas inlet and one gas outlet.

4. The system according to claim 2, wherein the wall surface is formed throughout as a double wall and has one gas inlet and one gas outlet.

5. The system according to claim 1, wherein the device for precipitation has at least a first extraction chamber and a second extraction chamber arranged in series, each having a gas outlet, whereby the gas outlet of the first extraction chamber is connected to a gas inlet of the second extraction chamber.

6. The system according to claim 2, wherein the device for precipitation has at least a first extraction chamber and a second extraction chamber arranged in series, each having a gas outlet, whereby the gas outlet of the first extraction chamber is connected to a gas inlet of the second extraction chamber.

7. The system according to claim 3, wherein the device for precipitation has at least a first extraction chamber and a second extraction chamber arranged in series, each having a gas outlet, whereby the gas outlet of the first extraction chamber is connected to a gas inlet of the second extraction chamber.

8. The system according to claim 1, wherein the wall surface of the precipitation chamber has an outer wall which has at least one coolant inlet and one coolant outlet, each of which are connected by a valve to a coolant channel.

9. The system according to claim 1, wherein a plurality of precipitation chambers are each detachably connected to each other, so that the precipitation chambers are individually removable from the device for precipitation.

10. The system according claim 2, wherein the improvement further comprises a valve connected between a coolant inlet of the wall channel and an inlet channel of a guide tube conducting coolant to the wall channel, said guide tube being connected to a coolant channel of a fixed-site coolant distributor.

11. The system according to claim 1, wherein the improvement further comprises a valve consisting essentially of a valve plug, a guide housing and a valve head coupled to the guide housing, where the valve is connected to a guide tube, and wherein the guide housing is attachable to the valve plug so that coolant from a coolant channel can flow through the valve into or from a wall channel of the precipitation chamber.

12. The system according to claim 1, wherein the improvement further comprises at least one valve designed as a blocking valve such that upon disconnection of a guide housing from a valve plug, the valve is blocked, so that coolant flow through a coolant channel and also to and from a wall channel of the precipitation chamber is interrupted.

13. In a method for growing silicon monocrystals from a silicon melt, wherein the method includes obtaining silicon monocrystal from the silicon melt in a melt chamber, collecting dust present over a surface of the silicon melt by capturing the dust in a gas stream to thereby produce a dust-gas mixture, and moving the dust-gas mixture away from the surface of the silicon melt, wherein the improvement comprises: conveying said dust in the dust-gas mixture away from the melt chamber, and flowing the dust-gas mixture into a device for precipitating the dust that includes a precipitation zone having at least one wall surface against which the dust-gas mixture flows to contact said wall surface, thereby adhering the dust to said wall surface, so that the dust is extracted from the gas.

14. The method according to claim 13, wherein said wall surface includes a double-walled chamber wall having a wall channel defined therein, and the method further comprises cooling said wall surface by supplying a coolant to the double-walled chamber wall through the wall channel.

15. The method according to claim 13, further comprising introducing said gas stream into said device for precipitating by a single gas inlet and removing said gas stream from said device for precipitating by a single gas outlet.

16. A device for precipitation of dust which is created during the manufacture of a crystal grown from a crystal growing melt and which dust can be added as a dust mixture to a transport gas for diverting it from a melt chamber holding said melt, the device comprising:

a plurality of precipitation chambers detachably connected to each other, wherein each of said chambers has at least one wall surface against which a dust-gas mixture flows in such a manner that upon contact with the wall surface, the dust adheres to said wall surface, so that the dust is precipitated from the gas, and wherein the precipitation chambers are individually removable from the device for precipitation.

17. A device for precipitation of dust which is created during the manufacture of a crystal grown from a crystal growing melt and which dust can be added as a dust mixture to a transport gas for diverting it from a melt chamber holding said melt, the device comprising:

at least one precipitation chamber, said chamber having at least one wall surface against which a dust-gas mixture flows in such a manner that upon contact with the wall surface, the dust adheres to said wall surface, so that the dust is precipitated from the gas, wherein said wall surface is at least partly a double-walled chamber wall, and the double-wall chamber wall has a wall channel to which a coolant is supplied; and a valve connected between a coolant inlet of the wall channel and an inlet channel of a guide tube conducting coolant to the wall channel, said guide tube being connected to a coolant channel of a fixed-site coolant distributor.

18. A device for precipitation of dust which is created during the manufacture of a crystal grown from a crystal growing melt and which dust can be added as a dust mixture to a transport gas for diverting it from a melt chamber holding said melt, the device comprising:

at least one precipitation chamber, said chamber having at least one wall surface against which a dust-gas mixture flows in such a manner that upon contact with the wall surface, the dust adheres to said wall surface, so that the dust is precipitated from the gas; and a valve consisting essentially of a valve plug, a guide housing and a valve head coupled to the guide housing, where the valve is connected to a guide tube, and wherein the guide housing is attachable to the valve plug so that coolant from a coolant channel can flow through the valve into or from a wall channel of the precipitation chamber.

19. A device for precipitation of dust which is created during the manufacture of a crystal grown from a crystal growing melt and which dust can be added as a dust mixture to a transport gas for diverting it from a melt chamber holding said melt, the device comprising:

at least one precipitation chamber, said chamber having at least one wall surface against which a dust-gas mixture flows in such a manner that upon contact with the wall surface, the dust adheres to said wall surface, so that the dust is precipitated from the gas; and at least one valve designed as a blocking valve such that upon disconnection of a guide housing from a valve plug, the valve is blocked, so that coolant flow through a coolant channel and also to and from a wall channel of the precipitation chamber is interrupted.

* * * * *